(12) United States Patent
Deshmukh et al.

(10) Patent No.: US 6,235,214 B1
(45) Date of Patent: May 22, 2001

(54) PLASMA ETCHING OF SILICON USING FLUORINATED GAS MIXTURES

(75) Inventors: Shashank Deshmukh, Sunnyvale; Jeffrey Chinn, Foster City, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/255,493

(22) Filed: Feb. 23, 1999

Related U.S. Application Data

(63) Continuation-in-part of application No. 09/206,201, filed on Dec. 3, 1998.

(51) Int. Cl.[7] .................................................. C03C 15/00
(52) U.S. Cl. .............................. 216/67; 216/79; 438/714; 438/719; 252/79.1
(58) Field of Search ........................ 216/67, 79; 438/714, 438/719, 721, 723, 724; 252/79.1

(56) References Cited

U.S. PATENT DOCUMENTS

| | | |
|---|---|---|
| 4,666,555 | 5/1987 | Tsang ..................................... 156/643 |
| 4,726,879 | 2/1988 | Bondur et al. ......................... 156/643 |
| 4,741,799 | 5/1988 | Chen et al. ............................ 156/643 |
| 5,358,601 | 10/1994 | Cathey ................................... 156/656 |
| 5,433,823 | 7/1995 | Cain ..................................... 156/662.1 |
| 5,458,734 | * 10/1995 | Tsukamoto ........................ 156/643.1 |
| 5,658,472 | 8/1997 | Bartha et al. ............................. 216/2 |
| 5,705,025 | * 1/1998 | Dietrich et al. .................... 156/643.1 |
| 5,759,921 | 6/1998 | Rostoker ............................... 438/711 |
| 5,843,847 | * 12/1998 | Pu et al. ................................ 438/723 |
| 5,854,136 | * 12/1998 | Huang et al. ......................... 438/714 |
| 5,900,163 | * 5/1999 | Yi et al. .................................. 216/79 |
| 5,994,160 | * 11/1999 | Niedermann et al. ................. 438/53 |

* cited by examiner

Primary Examiner—Randy Gulakowski
Assistant Examiner—Allan Olsen
(74) Attorney, Agent, or Firm—Thomason Moser Patterson

(57) ABSTRACT

A method of etching silicon using a gas mixture comprising fluorine (F) and oxygen (O). A fluoro-hydrocarbon gas is also used to provide added flexibility for profile and dimension control in the silicon trench. The method is applied to trench etching in a silicon substrate, and results in an etch rate exceeding about 1 $\mu$m/min. with a photoresist selectivity as high as about 9:1. The method can also be applied to etching doped or undoped polysilicon or amorphous silicon.

27 Claims, 4 Drawing Sheets

PLASMA ETCHING OF SILICON USING FLUORINATED GAS MIXTURES

CROSS-REFERENCE TO RELATED APPLICATIONS

This application is a continuation-in-part of commonly-assigned U.S. patent application Ser. No. 09/206,201, filed on Dec. 3, 1998, entitled "Plasma Etching of Polysilicon using Fluorinated as Mixtures", which is herein incorporated by reference.

BACKGROUND OF THE DISCLOSURE

1. Field of the Invention

The invention relates to a method of dry etching of semiconductor wafers and, more particularly, to a method of etching silicon using gas mixtures comprising fluorine (F) and oxygen (O).

2. Description of the Background Art

Trenches formed in semiconductor substrates have many uses in producing integrated circuits including isolation, capacitor formation, transistor formation, and the like. One important use of trenches is in the formation of gate structures for field effect transistors. In a conventional gate structure, trench walls are formed between a source region and a drain region. The walls and bottom of the trench are coated with a thin dielectric material, which is then conformally coated with polysilicon such that the polysilicon forms a gate electrode for a transistor.

Traditionally, gate trenches are formed using an anisotropic chemical or reactive ion etching of a masked silicon substrate. Etching chemistries utilize combinations of such chemicals as hydrogen bromide (HBr), chlorine ($Cl_2$), oxygen ($O_2$), nitrogen fluoride ($NF_3$), sulfur hexafluoride($SF_6$), and nitrogen ($N_2$). For example, an HBr/$Cl_2$) chemistry can provide a silicon etch rate of about 5000 Å/min. with a photoresist selectivity (defined as the ratio of the etch rate of silicon to that of photoresist) of between 3:1 to 4:1. To improve the throughput for wafer processing, it is desirable to maximize the silicon etch rate, especially for applications such as trench etching. In general, however, an increase in the silicon etch rate also decreases the photoresist etch selectivity.

Therefore, a need exists in the art for a silicon etching process having an increased silicon etch rate and an enhanced mask selectivity.

SUMMARY OF THE INVENTION

The present invention solves the above problem by providing an etch process with an increased silicon etch rate while enhancing photoresist selectivity. In particular, the invention is a method of etching a silicon substrate using a gas (or gas mixture) comprising fluorine (F) and oxygen (O). Anisotropic etching of silicon trenches can be accomplished at a total pressure of greater than 100 mtorr, at an etch rate exceeding about 1 $\mu$m/min. with an etch uniformity of about ±5%. A photoresist mask selectivity as high as about 9:1 can be achieved.

The invention can be practiced in a M×P etch chamber from Applied Materials, Inc., using a gas comprising, for example, $SF_6$ at about 40–60 sccm, $O_2$ at about 40–60 sccm and $CHF_3$ up to about 50 sccm, at a total pressure of about 100–400 mtorr and a cathode power of about 150–500 W. Silicon trench etching can be accomplished in either a single-step using a mixture of $SF_6/O_2/CHF_3$, or in two separate steps using first, a mixture of $SF_6/O_2/CHF_3$, followed by a mixture of $SF_6/O_2$. By adjusting the gas composition, operating pressure and power in individual steps, the trench profile and dimension can be tailored to specific needs.

The present invention can be adapted for etching other forms of silicon, such as doped or undoped polysilicon and amorphous silicon, and may also be used with either photoresist mask or hardmask materials.

BRIEF DESCRIPTION OF THE DRAWINGS

The teachings of the present invention can be readily understood by considering the following detailed description in conjunction with the accompanying drawings, in which:

FIG. 1b depicts a schematic top view of the plasma processing apparatus of FIG. 1a;

To facilitate understanding, identical reference numerals have been used, where possible, to designate identical elements that are common to the figures.

DETAILED DESCRIPTION

The present invention is a method of etching silicon by forming a plasma using a gas (or a gas mixture) comprising fluorine and oxygen. One specific embodiment of the invention uses a gas mixture comprising sulfur hexafluoride ($SF_6$), oxygen ($O_2$), and trifluoromethane ($CHF_3$). A similar gas mixture containing these three reactant gases has been used for etching polysilicon in a decoupled plasma source (DPS) reactor, manufactured by Applied Materials, Inc., of Santa Clara, Calif. That particular invention is described in a commonly-assigned U.S. patent application Ser. No. 09/206,201 (Attorney Docket 3258) entitled "Plasma Etching of Polysilicon using Fluorinated Gas Mixtures", filed on Dec. 3, 1998, and is herein incorporated by reference.

In one embodiment of the present invention, a gas mixture comprising $SF_6$, $O_2$ and $CHF_3$ is used to etch silicon in an etch chamber from the M×P product line available from Applied Materials, Inc., of Santa Clara, Calif. Such a chamber is described, for example, in two commonly assigned U.S. patent applications U.S. Pat. No 5,674,321, entitled "Method and Apparatus for Producing Plasma Uniformity in a Magnetic Field-Enhanced Plasma Reactor," and U.S. Pat. No 5,534,108, entitled "Method and Apparatus for Altering Magnetic Coil Current to Produce Etch Uniformity in a Magnetic Field-Enhanced Plasma Reactor," both of which are herein incorporated by reference.

Figure 1A:
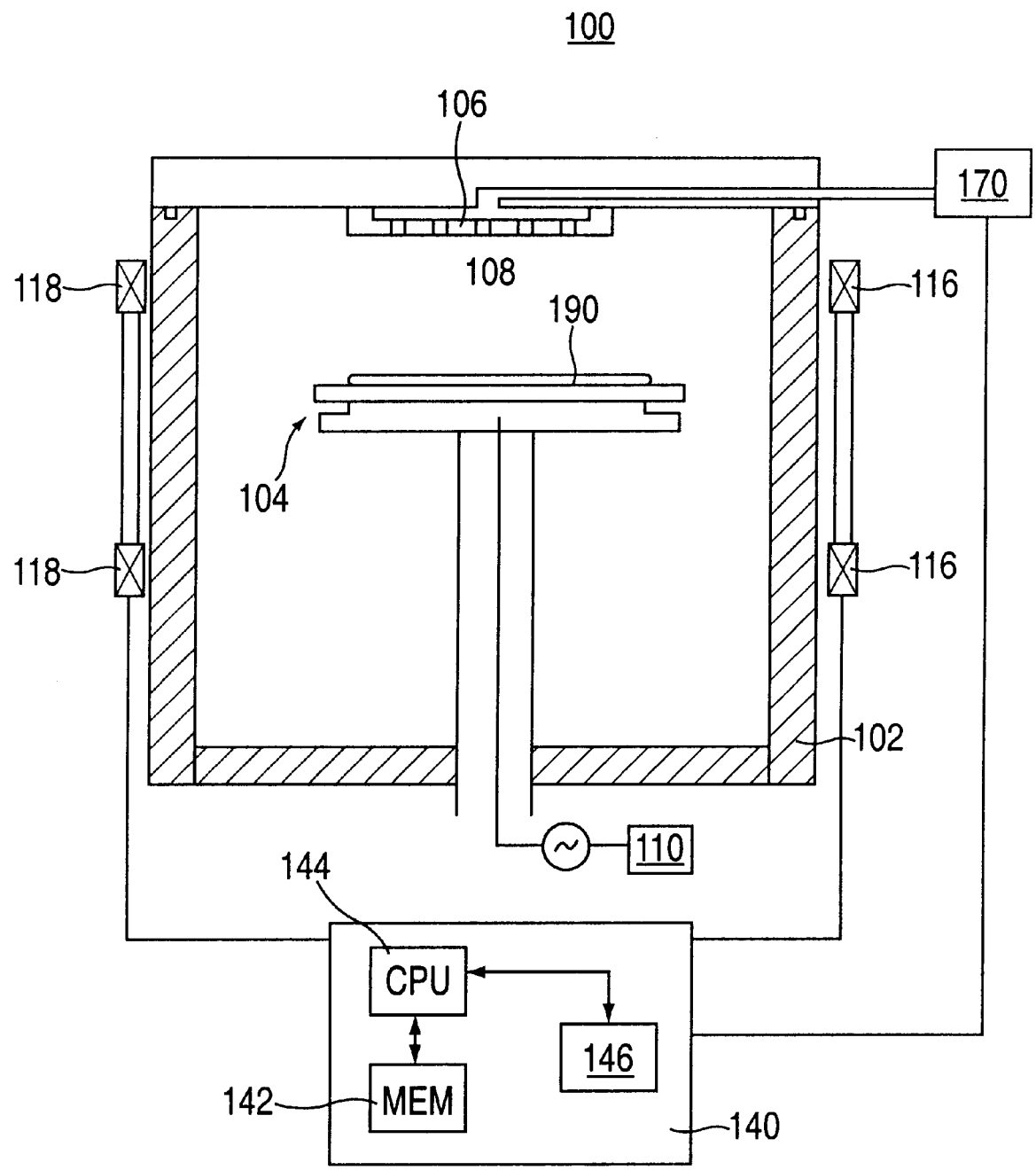
FIG. 1a depicts a schematic cross-sectional view of a plasma processing apparatus suitable for practicing the present invention.
Figure 1B:
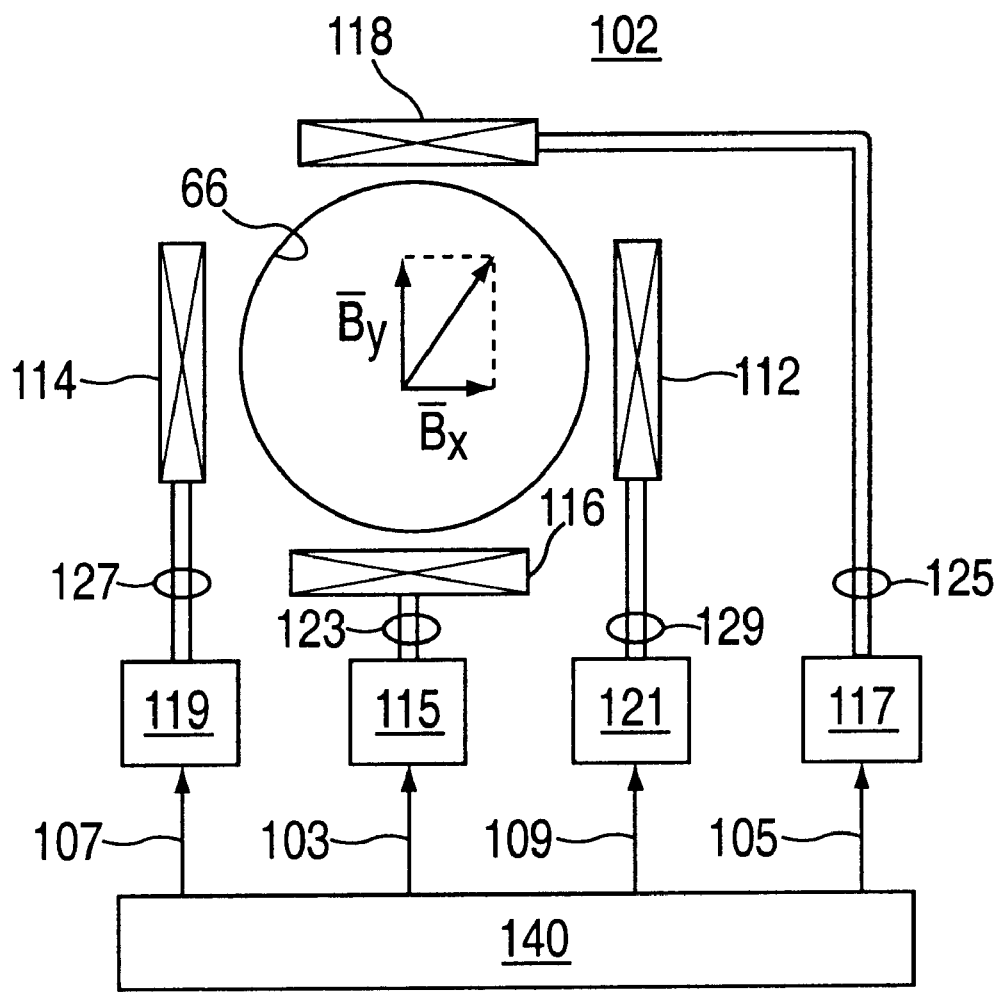

FIG. 1a depicts a schematic diagram illustrating a cross-sectional view of an etch reactor 100 suitable for performing silicon etching according to the present invention. One example of such a reactor is a M×P type chamber manufactured by Applied Materials, Inc. of Santa Clara, Calif. The reactor 100 comprises a chamber 102, a cathode/pedestal assembly 104 and a gas manifold 106. The gas manifold 106 supplies reactant gases from a gas supply 170 to a region 108 inside the chamber 102. The cathode/pedestal assembly 104 is connected to a radio frequency (RF) power source 110, which is used to generate a plasma in the region 108. During processing, a wafer 190 is supported by the pedestal/cathode assembly 104, and is etched by the reactive plasma generated from the reactant gases. FIG. 1b shows a schematic top view of the chamber 102, with a number of rectangular electromagnets 112, 114, 116, and 118 (comprising copper coils) arranged around the exterior of the chamber 102. Two opposing electromagnets, e.g., 116 and 118, connected respectively to power supplies 115 and 117, form one pair of coils. Similarly, the other two electromagnets, 112 and 114, form another coil pair connected respectively to two power supplies 121 and 119. A controller 140 is connected to the respective power supplies 115, 117, 119, 121 to control sinusoidal currents being applied to the two coil pairs 112, 114 and 116, 118. These sinusoidal currents are supplied 90 degrees out of phase such that a rotating magnetic field is generated within the chamber 102 parallel to the wafer 190. Furthermore, the currents are modulated either by varying the amplitude in a uniform rotating field period, or by varying the speed of rotation within a cycle of fixed amplitude and fixed period. Such modulation is used to improve the etch rate uniformity.

Referring back to FIG. 1a, a controller 140 comprising a central processing unit (CPU) 144, a memory 142, and support circuits 146 for the CPU is coupled to the various components of the M×P etch processing chamber 102 to facilitate control of the etch process. The CPU 144 may be one of any forms of general purpose computer processor that can be used in an industrial setting for controlling various chambers and subprocessors. The memory 142 is coupled to the CPU 144. The memory 142 may be one or more of readily available memory devices such as random access memory (RAM), read only memory (ROM), floppy disk, hard disk, or any other form of digital storage. The support circuits 146 are coupled to the CPU 144 for supporting the processor in a conventional manner. These circuits include cache, power supplies, clock circuits, input/output circuitry and subsystems, and the like. The control software that is used for implementing the etch process of the present invention is generally stored in memory 142 as a software routine. The software may also be stored and/or executed by a CPU that is remotely located from the hardware being controlled by the CPU.

When executed by the CPU 144, the software routine transforms the general purpose computer into a specific purpose computer (controller 140) that controls the chamber operation such that the etch process is performed. The specific process steps performed by the software routine are discussed in detail with respect to FIGS. 2a–2c below.

Although the process of the present invention is discussed as being implemented as a software routine, some of the method steps that are disclosed therein may be performed in hardware as well as by the software-based controller. As such, the invention may be implemented in software as executed upon a computer system, in hardware as an application specific integrated circuit or other type of hardware implementation, or a combination of software and hardware.

Figure 2A:
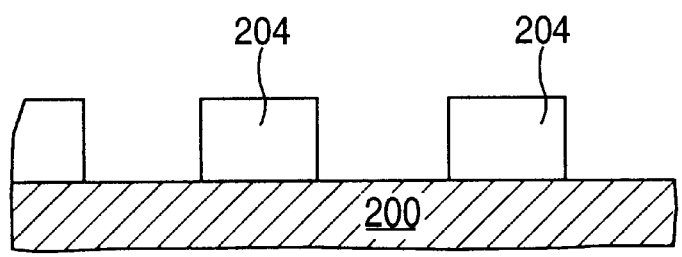
FIG. 2a–2c depict cross-sectional views of a wafer substrate at different stages of processing.
Figure 2B:
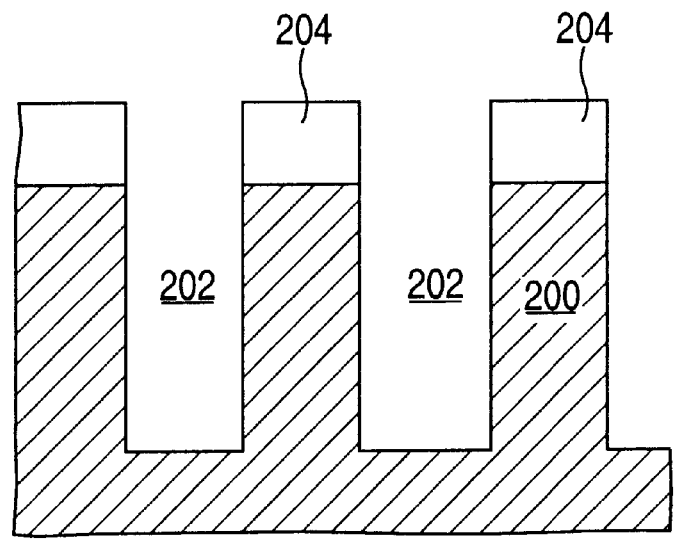

FIG. 2a shows a cross-sectional view of a silicon (Si) substrate 200 prior to etching. The layer of patterned photoresist 204 is formed, for example, by patterning a deep ultraviolet (DUV) resist layer using lithographic steps which are known to those skilled in the art.

Table 1 shows an etch recipe according to one embodiment of the present invention. The recipe can be used to generate a reactive plasma for etching the silicon substrate 200 to form trenches 202 similar to those depicted in FIG. 2b.

TABLE 1

Silicon Etch Process Recipe

| | (1) Break Through | (2) Trench Main Etch I | (3) Trench Main Etch II |
|---|---|---|---|
| $CF_4$ (sccm) | 35 | 0 | 0 |
| $SF_6$ (sccm) | 0 | 55 | 55 |
| $O_2$ (sccm) | 0 | 45 | 45 |
| $CHF_3$ (sccm) | 0 | 5 | 0 |
| Pressure (mtorr) | 100 | 230 | 300 |
| Cathode (W) | 400 | 200 | 280 |
| B-field (G) | — | 30 | 30 |
| Phase modulation | — | −5 | −5 |
| Temperature (deg. C.) | 30/65 cath./wall | 30/65 cath./wall | 30/65 cath./wall |
| Backside P (torr) | 4 | 4 | 4 |
| ESC voltage (V) | 1800 | 1800 | 1800 |

The etch recipe comprises three steps: 1) a break-through step; 2) a trench main etch I; and 3) a trench main etch II. Step 1 is used for initiating the etch process by breaking through a thin native oxide layer (not shown), which tends to form over a silicon surface upon exposure to air. This step is preferably performed at a flow rate of carbon tetrafluoride ($CF_4$) at about 35 sccm, a total pressure of about 100 mtorr and a power of about 400 W. Wider parameter ranges of 25–100 sccm $CF_4$, a pressure of 50–150 mtorr and a power of 300–500 W are also acceptable. Step 2 corresponds to an initial main trench etch, referred to as "main etch I". This is preferably performed using a $SF_6$ flow rate of about 55 sccm, $O_2$ flow rate of about 45 sccm, and $CHF_3$ flow rate of about 5 sccm at a total pressure of about 230 mtorr. Unlike step 1, a magnetic field of about 30 G is used during step 2, with a phase modulation setting of about −5. Acceptable parameter ranges include: a $SF_6$ flow of 40–60 sccm, an $O_2$ flow of 40–60 sccm, a $CHF_3$ flow of up to about 50 sccm (or between about 3–40% of the gas composition), a pressure of about 100–400 mtorr, and a power of about 150–500 W. Typically, step 2(main etch I) is allowed to proceed for about 15 sec. before the start of step 3, which is the second part of the trench etch, "main etch II". During step 3, only $SF_6$ and $O_2$ are used, with their respective flow rates remaining the same as in step 2. Preferably, the total pressure is increased to about 300 mtorr, and the power is increased to about 280 W. The magnetic field and modulation remain the same as in step 2.

Throughout the entire process, the cathode temperature is maintained within a range of about 10–60° C., preferably at about 30° C.; while the chamber wall temperature is kept preferably at about 65° C. The use of an electrostatic chuck (ESC) is an available option for the M×P chamber. With this option, a voltage of about 1800 volts is typically used to retain the wafer 190 upon the cathode/pedestal assembly 104. Furthermore, to improve thermal conduction between the wafer 190 and the cathode/pedestal assembly 104, a backside gas pressure is maintained at about 4 torr. Helium (He) and other gases, including nitrogen ($N_2$) or other inert gases, can be used as the backside gas.

The present invention offers several advantages, including a high silicon etch rate, a high selectivity to photoresist, excellent profile and dimension control, and a self-cleaning process. For example, near-vertical trench profiles have been achieved on product wafers at a silicon etch rate exceeding about 1.5 μm/min., and as high as about 2.5 μm/min., with a photoresist selectivity of between 7:1 to 9:1 and a within-wafer etch uniformity of about ±5%. The within-wafer etch uniformity is defined as $(ER_{max}-ER_{min})/(2ER_{avg})$, where $ER_{max}$ is the maximum etch rate, $ER_{min}$ is the minimum etch rate, and $ER_{max}$ is the average etch rate observed within a wafer.

The overall profile and dimension control in the etched trench can be achieved by adjusting a combination of process parameters such as the $CHF_3:SF_6:O_2$ ratio in main etch I, the $SF_6:O_2$ ratio in main etch II, and the respective operating pressures and powers. For example, the presence of $CHF_3$ in main etch I contributes to an improvement in photoresist selectivity by forming a polymer coating over the photoresist surface. This polymer coating prevents lateral resist attack, and helps provide dimension control in the etched trench. Typically, a gas mixture comprising about 5–10% of $CHF_3$ is preferred in step 2 (main etch I), although a range of about 3–40% is also acceptable. In general, depending on the flow rate, the presence of $CHF_3$ can provide sidewall passivation for both the photoresist and the silicon trench. For example, at a low $CHF_3$ concentration (or flow rate), the effect of sidewall passivation is primarily noticeable only for the photoresist 204. As the $CHF_3$ concentration (or flow rate) is increased, $CHF_3$ will also contribute to sidewall passivation of the trench 202, and thus affects the profile and/or dimension of the trench 202.

Figure 3A:
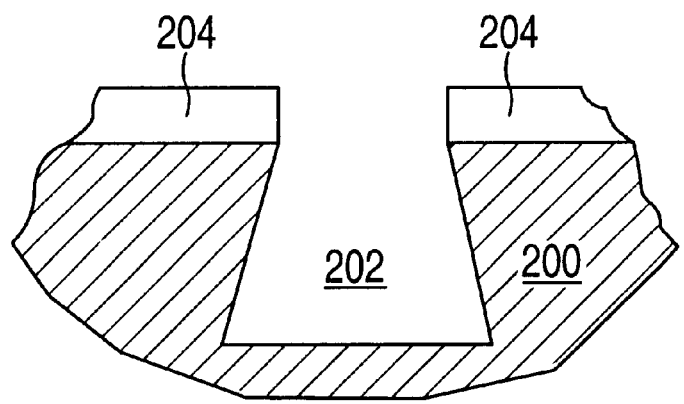
FIG. 3a–3c illustrate cross-sectional views of different etch profiles.
Figure 3B:
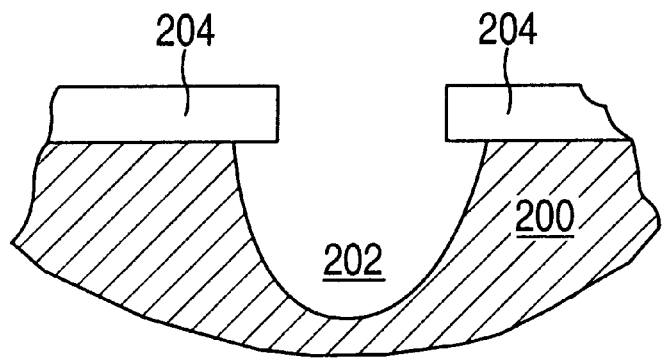
Figure 3C:
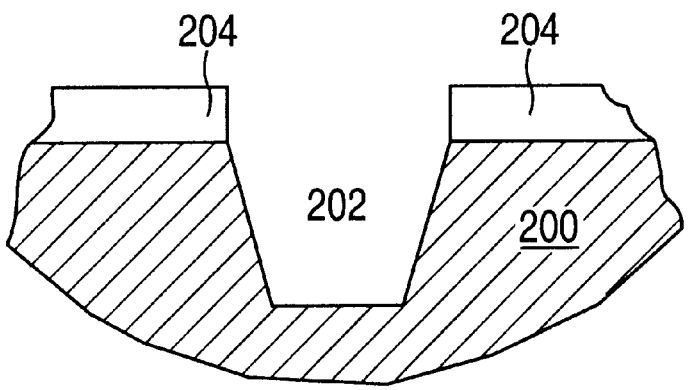

Therefore, profile control of the trench 202 can be achieved by varying the gas compositions in steps (2) and (3) illustrated in the etching recipe of Table 1. In particular, the ratio of $SF_6$ to $O_2$ can be adjusted to obtain different trench profiles. $SF_6$, for example, is a source of etchant species such as atomic fluorine (F), and generally contributes to isotropic etching. The presence of $O_2$, or more generally, oxygen element (O), on the other hand, impedes the isotropic etching component by interacting with Si and/or other species present in the plasma to form a protective layer on the sidewall of the trench. Using the trench etch recipe shown in Table 1, the sidewall of the Si trench is protected from lateral etching by the formation of, for example, an oxide such as silicon oxide, e.g., $Si_xO_y$. Typically, a large ratio of fluorine to oxygen, F:O, (e.g., by increasing $SF_6$ flow rate relative to $O_2$) leads to a trench profile with an undercut, such as those illustrated in FIGS. 3a–3b; while a reduced $SF_6:O_2$ ratio results in a tapered profile similar to that illustrated in FIG. 3c. At some intermediate $SF_6:O_2$ ratio, a near-vertical trench profile, such as that shown in FIG. 2b, can be achieved. Using the present invention for power transistor applications, 2 $\mu$m deep trenches in a silicon substrate can be etched with near-vertical profiles. The present recipe can also be extended to shallow (about 5000 Å deep) as well as deep (about 5–8 $\mu$m deep) trenches. Again, profile and dimension can be tailored as desired by adjusting, for example, the compositions of the gas mixtures, operating pressure and power. It should be noted that "gas mixture" and "gas", as used in this discussion, are interchangeable, and either usage should be interpreted broadly to include situations corresponding to a single-component gas as well as a multi-component gas. For example, a gas comprising fluorine (F) and oxygen (O) includes either a single-component gas or a multi-component gas mixture (e.g., $SF_6$ and $O_2$) containing the elements fluorine (F) and oxygen (O).

The present invention offers another advantage over conventional HBr-based chemistry—the process is "self-cleaning". In contrast to HBr-based etch recipes, the process of the present invention does not result in undesirable deposits inside the chamber 102. Therefore, the chamber 102 does not require wet cleaning, and equipment downtime during routine maintenance can be reduced.

In another embodiment, a gas mixture comprising $SF_6$, $O_2$ and $CHF_3$ are used in a single-step etch recipe comprising a wider range of $CHF_3$ flow rate—for example, as high as about 50–60% of the gas composition. Table 2 illustrates some of the preferred process parameters for this alternative embodiment.

TABLE 2

Silicon Etch Process Recipe

| | Trench Main Etch |
|---|---|
| SF6 | 55 sccm |
| O2 | 45 sccm |
| CHF3 | 20 sccm |
| Pressure | 200 mtorr |
| Cathode | 250 W |

Other parameters and wider ranges for gas flows, pressure and power are the same as those previously stated for the recipe in Table 1. A higher $CHF_3$ composition, up to about 50–60%, can be used in this embodiment. At the high $CHF_3$ flow rate, the effect of sidewall passivation is further increased such that a photoresist selectivity of greater than about 15:1 can be achieved with a silicon etch rate of about 1 $\mu$m/min. In general, for a gas mixture having a higher $CHF_3$ content, sidewall protection for the Si trench may also encompass formation of other protective coating including, for example, polymeric materials.

In either of the embodiments discussed above, other fluorinated gases (defined generally as those containing the fluorine element), including $NF_3$ and $CF_4$ among others, can be used in the etch recipe as a source of etchant species. Likewise, other fluoro-hydrocarbon gases (i.e., those containing at least F, H, and C elements), such as $CH_2F_2$, $CH_3F$ among others, may also be used to provide added flexibility in profile and dimension control.

Figure 2C:
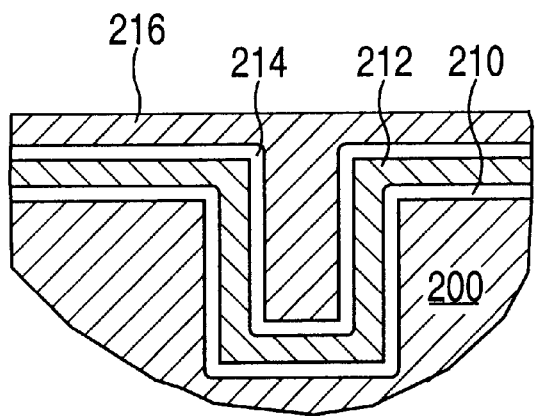

After forming the trench 202 in the Si substrate 200, the photoresist 204 can be removed using conventional resist stripping steps, followed by a post-etch clean procedure. For example, the clean procedure may include a 15 min. clean in a 1:1 mixture of sulfuric acid and hydrogen peroxide at about 120° C., followed by a 15 sec. dip in a 1% hydrofluoric acid at about 20° C. Additional processing steps can then be performed to form a transistor structure such as that shown in FIG. 2c. These additional processing steps may include, for example, forming a thin oxide layer 210 (e.g., gate oxide) over the trench 202, forming a doped polysilicon layer 212 (e.g., gate) over the oxide layer 210, followed by depositing or growing another oxide layer 214. Finally, a planarized layer of undoped polysilicon 216 can be formed by depositing polysilicon over the oxide layer 214, followed by planarization etchback using, for example, a $SF_6/O_2$ chemistry. Techniques such as oxidation, deposition and planarization used in forming the transistor structure of FIG. 2c are well-known to those skilled in the art. Of course, the process recipes of the present invention can also be used for other trench applications, including, for example, isolation and capacitor structures.

Aside from etching single crystal Si substrate, the present invention is also applicable to other forms of silicon such as amorphous silicon and polysilicon material layers, including doped and undoped materials. The use of a photoresist mask is meant to be illustrative only, and the present invention can readily be used in conjunction with other masking layers, including hardmasks such as oxide or nitride. Again, desired etch rate, selectivity, profile and dimensional control can be tailored to the specific needs by adjusting the process parameters as previously discussed. The use of the M×P etch chamber in connection with the present invention is meant to be illustrative only, and the process recipes can be adapted for implementation in other plasma environments, including, for example, remote plasmas.

Although several preferred embodiments which incorporate the teachings of the present invention have been shown and described in detail, those skilled in the art can readily devise many other varied embodiments that still incorporate these teachings.

What is claimed is:

1. A method of wafer processing comprising the steps of:
supplying a gas mixture comprising a first gas containing fluorine (F), a second gas containing oxygen (O) and a third gas containing fluorine (F), carbon (C) and hydrogen (H) to a chamber at a total pressure of greater than about 100 mtorr;
igniting a plasma within said chamber; and
etching a silicon layer within said chamber.

2. The method of claim 1, wherein said first gas is selected from a group of $SF_6$, $NF_3$ and $CF_4$.

3. The method of claim 1, wherein said third gas is a fluoro-hydrocarbon gas having a composition of less than about 60% in the gas mixture.

4. The method of claim 3, wherein said fluoro-hydrocarbon gas is selected from a group of $CHF_3$, $CH_2F_2$, and $CH_3F$.

5. The method of claim 1 wherein a flow ratio of said second gas to said first is greater than about 2:3.

6. The method of claim 1 wherein said gas mixture comprises $SF_6$, $O_2$ and $CHF_3$.

7. The method of claim 6, wherein said gas mixture comprises flow rates of $SF_6$ at about 40–60 sccm, $O_2$ at about 40–60 sccm, and $CHF_3$ at less than about 50 sccm.

8. A method of wafer processing comprising the steps of:
supplying a first gas comprising fluorine (F), a second gas comprising oxygen (O), and a third gas comprising fluorine (F), hydrogen (H) and carbon (C) to a chamber wherein a flow ratio of said second gas to said first gas is greater than about 2:3,
igniting a plasma within said chamber; and
etching a silicon layer within said chamber.

9. The method of claim 8, wherein said first gas is selected from a group of $SF_6$, $NF_3$ and $CF_4$.

10. The method of claim 8, wherein said third gas is a fluoro-hydrocarbon gas present in a composition of less than about 60% in the chamber.

11. The method of claim 10, wherein said fluoro-hydrocarbon gas is selected from a group of $CHF_3$, $CH_2F_2$, and $CH_3F$.

12. The method of claim 8 wherein said etching is performed at a pressure of greater than about 100 mtorr.

13. The method of claim 8 wherein said first gas comprises $SF_6$, said second gas comprt $O_2$ and said fluoro-hydrocarbon gas comprises $CHF_3$.

14. The method of claim 13, wherein said gases are supplied at flow rates of: $SF_6$ at a 40–60 sccm, $O_2$ at about 40–60 sccm, and $CHF_3$ at less than about 50 sccm.

15. A method of wafer processing comprising the steps of:
(a) partially etching a silicon layer using a first reactive plasma generated from a gas comprsing a fluoro-hydrocarbon gas; and
(b) etching said silicon layer from said step (a) through a masking layer using a second reactive plasma generated from a gas mixture comprising a first gas containing fluorine (F) and a second gas containing oxygen (O), wherein a flow ratio of said second gas to said first gas is greater than about 2:3, and wherein said steps (a) and (b) are performed at a pressure greater than about 100 mtorr.

16. The method of claim 15, wherein said first gas in step (b) is selected from a group of $SF_6$, $NF_3$ and $CF_4$.

17. The method of claim 15, wherein said gas in said step (a) further comprises a first gas comprising fluorine (F) and a second gas comprising oxygen (O).

18. The method of claim 15, wherein said fluoro-hydrocarbon gas of said step (a) is selected from a group of $CHF_3$, $CH_2F_2$, and $CH_3F$.

19. The method of claim 15 wherein said gas in said step (a) comprises $SF_6$, $O_2$ and $CHF_3$.

20. The method of claim 15, wherein said gas in said step (a) comprises a $SF_6$ flow rate of about 40–60 sccm, an $O_2$ flow rate at about 40–60 sccm, and a $CHF_3$ flow rate of less than about 50 sccm.

21. The method of claim 15 wherein said first gas in said step (b) comprises $SF_6$ at a flow rate of about 40–60 sccm, and said second gas in said step (b) comprises $O_2$ at a flow rate of about 40–60 sccm.

22. The method of claim 15 wherein said silicon layer is etched at a rate of at least 10,000 Å/min. and said masking layer is etched at a rate less than ¼ of said etch rate of said silicon layer.

23. A method of silicon processing comprising the steps of:
(a) exposing a substrate containing a silicon layer to a first reactive plasma generated from a gas comprising carbon tetrafluoride ($CF_4$);
(b) partially etching said silicon layer using a second reactive plasma generated from a gas comprising sulfur hexafluoride ($SF_6$), trifluoromethane ($CHF_3$) and oxygen ($O_2$);
(c) etching said silicon layer through a masking layer using a third reactive plasma generated from a gas comprising $SF_6$ and $O_2$.

24. The method of claim 23, wherein said steps (b) and (c) are performed at a flow ratio of $O_2:SF_6$ greater than about 2:3.

25. The method of claim 23, wherein said steps (a), (b) and (c) are performed at a total pressure of greater than about 100 mtorr.

26. The method of claim 23, wherein said step (a) is performed at a $CF_4$ flow rate of about 25–100 sccm; said step (b) is performed at a $SF_6$ flow rate of about 40–60 sccm, an $O_2$ flow rate of about 40–60 sccm, and a $CHF_3$ flow rate of less than about 50 sccm; and said step (c) is performed at a $SF_6$ flow rate of about 40–60 sccm and an $O_2$ flow rate of about 40–60 sccm.

27. The method of claim 26, wherein said silicon layer is etched at an overall etch rate of greater than about 10,000 Å/min. and said masking layer is etched at an overall rate less than about ¼ of said etch rate of said silicon layer.

* * * * *

UNITED STATES PATENT AND TRADEMARK OFFICE
CERTIFICATE OF CORRECTION

PATENT NO.    : 6,235,214 B1
DATED         : May 22, 2001
INVENTOR(S)   : Deshmukh et al.

It is certified that error appears in the above-identified patent and that said Letters Patent is hereby corrected as shown below:

Column 1,
Line 9, please replace "as Mixtures" with -- Gas Mixtures --.
Line 35, please replace "HBr/Cl$_2$)" with -- HBr/Cl$_2$ --.

Column 7,
Line 33, please replace "first is" with -- first gas is --.
Line 44, please replace "2:3," with -- 2:3; --.
Line 58, please replace "comprt" with -- comprises --.
Line 61, please replace "at a" with -- at about --.

Column 8,
Line 52, please replace "25-100" with -- 25-1000 --.

Signed and Sealed this

Sixteenth Day of April, 2002

Attest:

*Attesting Officer*

JAMES E. ROGAN
*Director of the United States Patent and Trademark Office*